(12) United States Patent
Gommé et al.

(10) Patent No.: US 10,992,392 B2
(45) Date of Patent: Apr. 27, 2021

(54) NEAR-FIELD ELECTROMAGNETIC INDUCTION (NFEMI) RATIO CONTROL

(71) Applicant: NXP B.V., Eindhoven (NL)

(72) Inventors: Liesbeth Gommé, Anderlecht (BE); Anthony Kerselaers, Herselt (BE)

(73) Assignee: NXP B.V., Eindhoven (NL)

( * ) Notice: Subject to any disclaimer, the term of this patent is extended or adjusted under 35 U.S.C. 154(b) by 63 days.

(21) Appl. No.: 16/122,970

(22) Filed: Sep. 6, 2018

(65) Prior Publication Data
US 2020/0083962 A1   Mar. 12, 2020

(51) Int. Cl.
| H04B 13/00 | (2006.01) |
| G01R 33/02 | (2006.01) |
| G01V 3/08 | (2006.01) |
| H04B 5/00 | (2006.01) |
| H04B 10/00 | (2013.01) |

(52) U.S. Cl.
CPC .......... *H04B 13/005* (2013.01); *G01R 33/02* (2013.01); *G01V 3/088* (2013.01); *H04B 5/0031* (2013.01); *H04B 5/0068* (2013.01); *H04B 5/0081* (2013.01); *H04B 10/00* (2013.01)

(58) Field of Classification Search
CPC combination set(s) only.
See application file for complete search history.

(56) References Cited

U.S. PATENT DOCUMENTS

| 9,197,986 B1 | 11/2015 | Kerselaers et al. | |
| 10,009,069 B2* | 6/2018 | Kerselaers | H04B 5/0037 |
| 10,014,578 B2* | 7/2018 | Kerselaers | H04B 13/005 |
| 10,015,604 B2* | 7/2018 | Kerselaers | H04R 25/554 |
| 10,862,542 B1* | 12/2020 | Kerselaers | H04B 5/0081 |
| 2008/0306359 A1* | 12/2008 | Zbeblick et al. | |
| 2011/0094996 A1* | 4/2011 | Yamazawa | H01J 37/32146 216/68 |
| 2012/0235508 A1* | 9/2012 | Ichikawa | H04B 5/0093 307/104 |
| 2013/0099592 A1* | 4/2013 | Abe | |

(Continued)

FOREIGN PATENT DOCUMENTS

EP    2942876 A1    11/2015

OTHER PUBLICATIONS

IEEE Computer Society; "IEEE Standard for Local and metropolitan area networks—Part 15.6: Wireless Body Area Networks"; 271 pages (Feb. 29, 2012).

*Primary Examiner* — Lewis G West

(57) ABSTRACT

One example discloses a first near-field electromagnetic induction (NFEMI) device, including: a controller configured to be coupled to an NFEMI antenna and to a structure; wherein the NFEMI antenna includes electric (E) near-field and magnetic (H) near-field generating and/or receiving portions; wherein the controller is configured to modulate a ratio of energy sent to and/or received from the electric and magnetic portions; wherein the controller is configured to receive a signal corresponding to whether the structure is between the first NFEMI device and a second NFEMI device; and wherein the controller is configured to decrease the ratio of energy sent to and/or received from the electric (E) portion as compared to energy sent to and/or received from the magnetic (H) portion if the structure is between the first and second NFEMI devices.

20 Claims, 7 Drawing Sheets

(56) References Cited

U.S. PATENT DOCUMENTS

| | | | |
|---|---|---|---|
| 2014/0314456 A1* | 10/2014 | Kikuchi | G03G 15/2042 399/329 |
| 2015/0318603 A1* | 11/2015 | Kerselaers | H04B 13/005 381/315 |
| 2015/0318613 A1* | 11/2015 | Kerselaers | H01Q 7/005 381/315 |
| 2015/0318896 A1* | 11/2015 | Kerselaers | H02J 5/005 455/41.1 |
| 2015/0318932 A1* | 11/2015 | Kerselaers | H04B 5/02 381/315 |
| 2015/0319545 A1 | 11/2015 | Kerselaers et al. | |
| 2016/0149313 A1* | 5/2016 | Gomme et al. | |
| 2017/0272128 A1 | 9/2017 | Tanaka | |
| 2017/0324170 A1* | 11/2017 | Kerselaers | H04B 5/0031 |
| 2018/0219273 A1* | 8/2018 | Kerselaers | H01Q 1/2283 |
| 2018/0241116 A1* | 8/2018 | Kerselaers | H01Q 1/44 |
| 2019/0296439 A1* | 9/2019 | Kerselaers | H01Q 7/00 |

\* cited by examiner

NEAR-FIELD ELECTROMAGNETIC INDUCTION (NFEMI) RATIO CONTROL

The present specification relates to systems, methods, apparatuses, devices, articles of manufacture and instructions for near-field electromagnetic induction (NFEMI) antennas.

SUMMARY

According to an example embodiment, a first near-field electromagnetic induction (NFEMI) device, comprising: a controller configured to be coupled to an NFEMI antenna and to a structure; wherein the NFEMI antenna includes electric (E) near-field and magnetic (H) near-field generating and/or receiving portions; wherein the controller is configured to modulate a ratio of energy sent to and/or received from the electric and magnetic portions; wherein the controller is configured to receive a signal corresponding to whether the structure is between the first NFEMI device and a second NFEMI device; and wherein the controller is configured to decrease the ratio of energy sent to and/or received from the electric (E) portion as compared to energy sent to and/or received from the magnetic (H) portion if the structure is between the first and second NFEMI devices.

In another example embodiment, the controller is configured to increase the ratio of the energy sent to and/or received from the electric (E) portion as compared to the energy sent to and/or received from the magnetic (H) portion if the structure is not between the first and second NFEMI devices.

In another example embodiment, the ratio is calculated as: electric field (E-field) energy divided by magnetic field (H-field) energy.

In another example embodiment, the ratio is calculated as: electric field (E-field) amplitude divided by magnetic field (H-field) amplitude.

In another example embodiment, the ratio is calculated as: electric field (E-field) phase subtracted by magnetic field (H-field) phase.

In another example embodiment, the controller is configured to receive the signal corresponding to whether the structure is between the devices from at least one of: inertial sensors, a user input, a communication between the devices with respect to a location reference, wireless, cellular, and/or GPS reference.

In another example embodiment, between includes at least one of: wholly blocked, partially blocked, on a different side of the structure, not on a same side of the structure, on front to back sides, or on left and right sides.

In another example embodiment, further comprising a plurality of NFEMI device; and wherein the controller is configured to vary the ratio of the electric (E) field to the magnetic (H) field based on which NFEMI device is communicating to which other NFEMI device.

In another example embodiment, a unique ratio is used for each pair of communicating NFEMI device; and the unique ratio is based on a distance between the devices and/or an attenuation due to the structure between the devices.

In another example embodiment, the NFEMI antenna of the first NFEMI device has a first magnetic field orientation; the second NFEMI device includes an NFEMI antenna having a second magnetic field orientation; and the first magnetic field orientation is in parallel with the second magnetic field orientation.

In another example embodiment, the structure is a human body; and the first NFEMI device is positioned at a chest location on the human body, and the second NFEMI device is positioned at a spine location on the human body.

In another example embodiment, the structure is a conductive structure.

In another example embodiment, the structure is at least one of: an organic structure, a biological surface, an inorganic structure, a package, clothing, a vehicle surface, a chair, a wall, and/or a merchandise item.

In another example embodiment, the device is embedded in at least one of: a smart phone, a smart watch, a sensor, a medical sensor, or an audio device.

In another example embodiment, the ratio is decreased by increasing the magnetic field energy.

In another example embodiment, the ratio is decreased by decreasing the electric field energy.

In another example embodiment, the NFEMI antenna interface includes first and second coupling points; the H-field signal is generated by a coil coupled to the first and second coupling points; and the E-field signal is generated by a conductive surface coupled to either of or both the first and second coupling points.

In another example embodiment, the conductive surface includes a first conductive plate and a second conductive plate separated by a distance; and the first conductive plate is coupled to the first coupling point and the second conductive plate is coupled to the second coupling point.

In another example embodiment, further comprising: the NFEMI antenna coupled to the controller; and a transmitter and/or to a receiver circuit couple to the controller.

According to an example embodiment, an article of manufacture including at least one non-transitory, tangible machine readable storage medium containing executable machine instructions for near-field electromagnetic induction (NFEMI) communication when executed by a processor: wherein the article includes, a first near-field electromagnetic induction (NFEMI) device including a controller; wherein the controller configured to be coupled to an NFEMI antenna and to a structure; wherein the NFEMI antenna includes electric (E) near-field and magnetic (H) near-field generating and/or receiving portions; and wherein the instructions include, modulating a ratio of energy sent to and/or received from the electric and magnetic portions; receiving a signal corresponding to whether the structure is between the first NFEMI device and a second NFEMI device; and decreasing the ratio of energy sent to and/or received from the electric (E) portion as compared to energy sent to and/or received from the magnetic (H) portion if the structure is between the first and second NFEMI devices.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
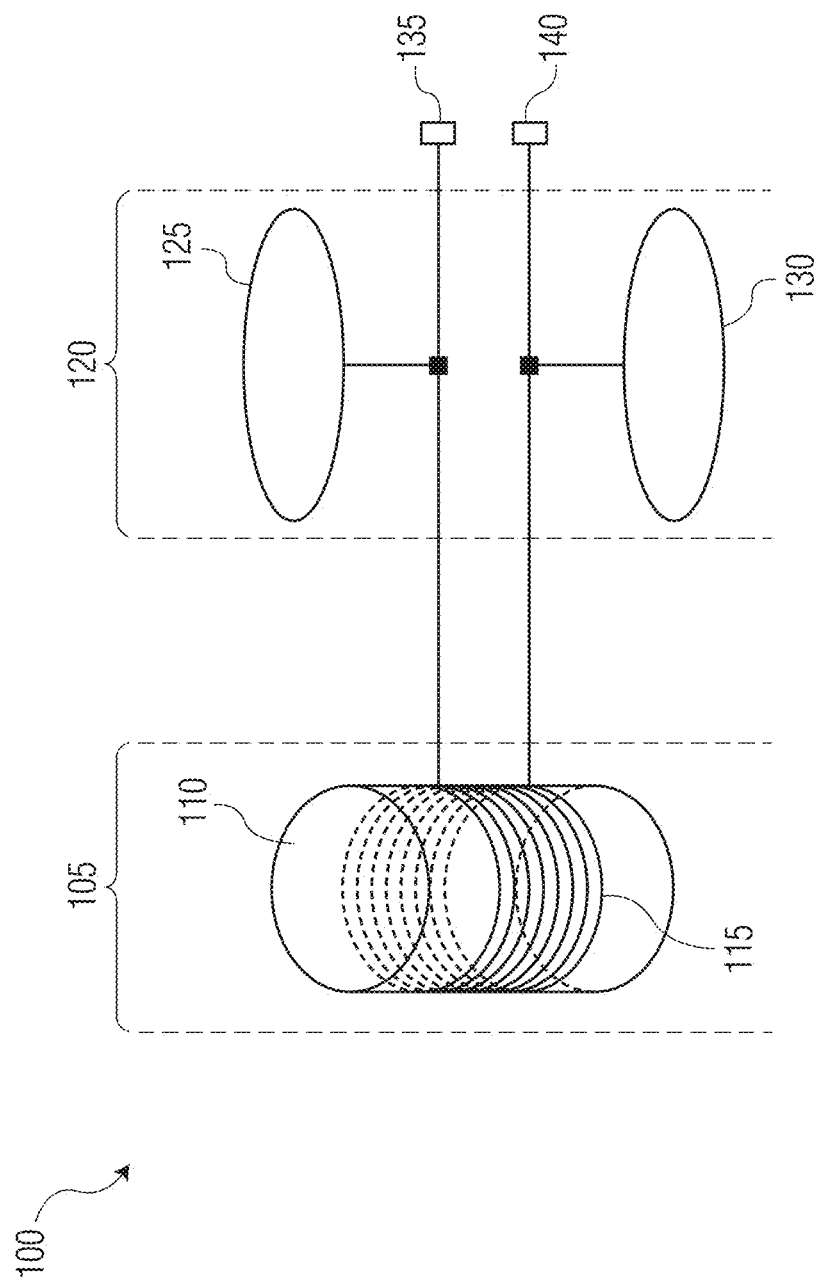
FIG. 1 is an example idealized single coil near-field electromagnetic induction (NFEMI) antenna.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Herein discussed are communication and other wireless networked devices based on near-field electromagnetic induction (NFEMI), where the transmitter and receiver are coupled by both magnetic (H) and electric (E) fields. While RF wireless communication is accomplished by propagating an RF plane wave through free space, NFEMI communication utilizes non-propagating quasi-static H and E fields.

An H-field antenna (i.e. magnetic antenna) is primarily sensitive to magnetic fields and/or primarily initiates magnetic fields when driven by a current. Any E-field component from an H-field antenna is strongly reduced (e.g. −20 to −60 dB reduction, a factor of 0.1 to 0.0008 (10% to 0.08%) depending on the antenna design).

A small loop antenna is an example H-field antenna and includes a loop antenna with dimensions much smaller than the wavelength of its use. The small loop antenna does not resonate at the NFEMI carrier frequency but is instead tuned to resonance by an external reactance. In some example embodiments the current in the small loop antenna has in every position of the loop the same value.

An E-field antenna (i.e. electric antenna) is primarily sensitive to electric fields and/or primarily initiates electric fields when driven by a voltage. Any H-field component from an E-field antenna is strongly reduced (e.g. −20 to −60 dB reduction, a factor of 0.1 to 0.0008 (10% to 0.08%) depending on the antenna design).

A short loaded dipole antenna is an example E-field antenna and includes a short dipole with dimensions much smaller than the NFEMI carrier frequency and in some example embodiments has extra capacitance structures at both ends.

The quasi-static characteristic of these fields is a result of the NFEMI antenna dimensions in combination with their carrier frequencies. Most of the near-field energy is stored in the form of magnetic and electric fields, while a small amount of RF energy inevitably propagates in free space. Small antenna geometries minimize radiating waves in free space.

Some wearables, such as hearing aids and wireless earbuds, employ Near-Field Magnetic Induction (NFMI) as a wireless communication method. In NFMI wireless communication, two loosely coupled coils realize signal transfer. No radiation of radio waves takes place. A current flowing in the transmission coil generates a H-field which in turn induces a current in the receiving coil. In this way, wireless communication is accomplished. Unfortunately, H-field based NFMI systems with small antenna coils have a limited range and are sensitive to coil orientation. In the case of a hearing aid form factor, a H-field induction based system cannot cover an entire human body. However, since in hearing aids both coils are always aligned with each other, they are not influenced by the movement of the human body.

Other wearables employ Near-field Electric Induction (NFEI)) as a wireless communication method. NFEI allows electronic devices on and near a conductive structure (e.g. a human body) to exchange information through E-field coupling (e.g. at 21 MHz). NFEI is also sometimes called Body Coupled Communication (BCC). While E-field based NFEI signals can have a greater range than H-field based NFMI signals, the E-field signal strength can vary with regard to body posture and is sensitive to body movements. The body can even partially block a capacitive return path, thereby increasing E-field channel loss and reliable and robust wireless communication is not possible.

Providing robust near-field full body, or full structure, communications is desired. This includes longer distance head-to-toe communications as well as front-to-back communications. NFEMI circuits, structures, and tuning methods for accomplishing this goal are now discussed.

FIG. 1 is an example idealized single coil near-field electromagnetic induction (NFEMI) antenna 100. The antenna 100 in this example is an electromagnetic induction (NFEMI) antenna. In some example embodiments, the antenna 100 includes a coil (H-field) antenna 105 for magnetic fields, in conjunction with a short loaded dipole (E-field) antenna 120 for electric fields. The H-field antenna 105 includes a ferrite core 110 wound with wire 115. The E-field antenna 120 includes two conductive loading structures 125 and 130. Antenna 100 feed points 135, 140 are coupled to various transceiver circuitry, such as downstream radio transmitter and receiver integrated circuit (RF-IC), (not shown here).

When the NFEMI antenna 100 is proximate to a structure (e.g. a conductive structure, a body, a person, an object, etc.) the magnetic and electric fields will be substantially confined to the structure and not significantly radiate in free-space. This enhances security and privacy of such body networked communications.

In various example embodiments, the antenna 100 operates at or below 50 MHz (e.g. for example at 30 MHz) to ensure that the fields are following the structure's contours and to ensure that far field radiation is strongly reduced.

Figure 2:
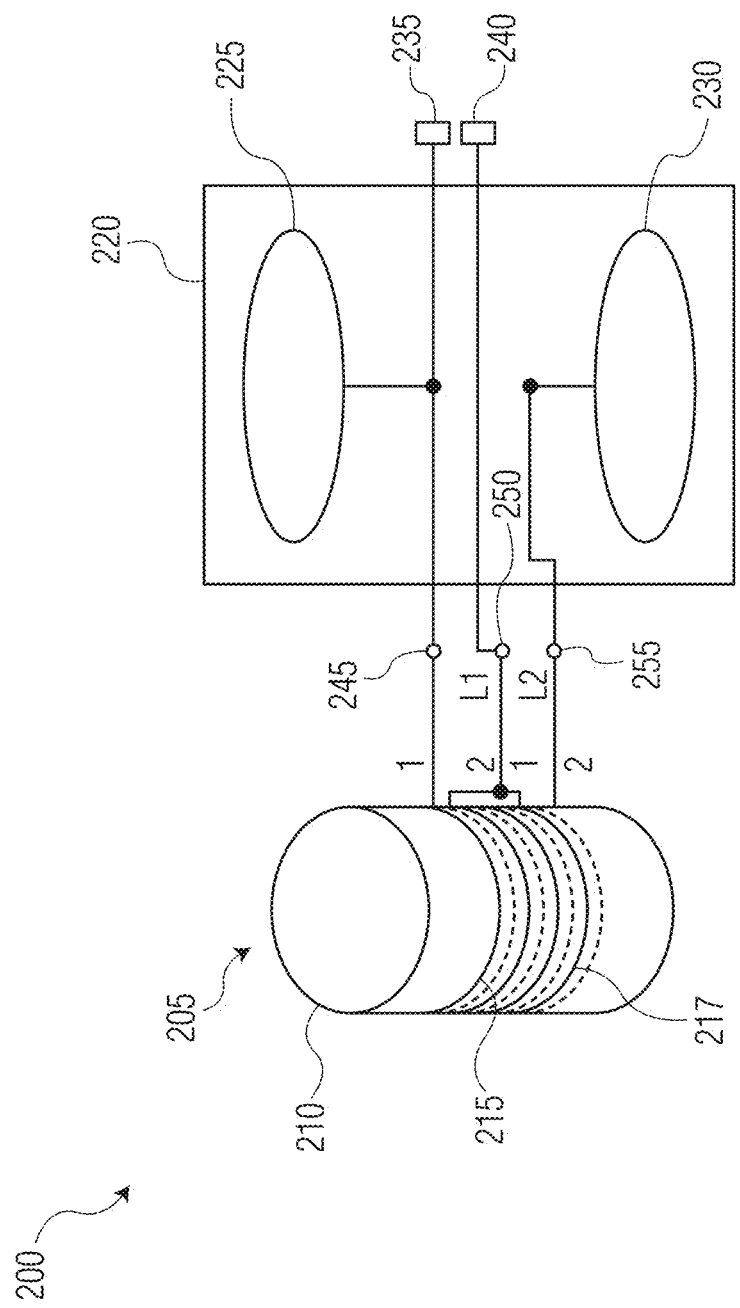
FIG. 2 is an example idealized dual coil NFEMI communications antenna.

FIG. 2 is an example idealized dual coil NFEMI antenna 200. The antenna 200 includes a short loaded dipole portion 220 with two conductive loading plates 225, 230 and a small loop antenna 205.

The small loop antenna includes at least two coupled coils 215 and 217. The first coil 215 has an inductance of L1, and the second coil 217 has an inductance of L2. Both coils 215 and 217 may be connected, at connection point 250, such that they form a larger inductance compared with the inductance of the first coil 215 and the second coil 217.

Figure 3A:
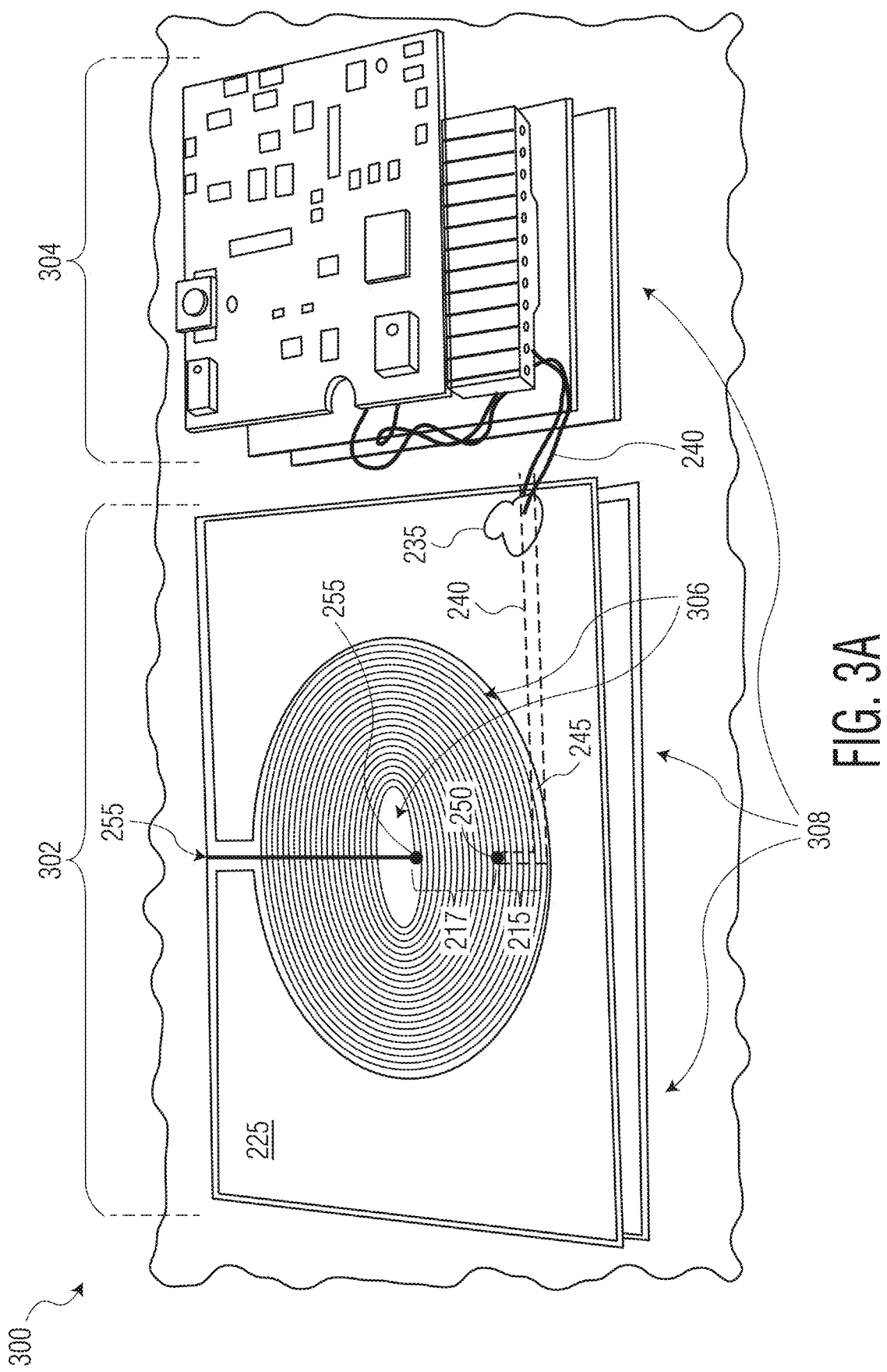
FIG. 3A is an example first side of a manufactured dual coil NFEMI antenna device 300.
Figure 3B:
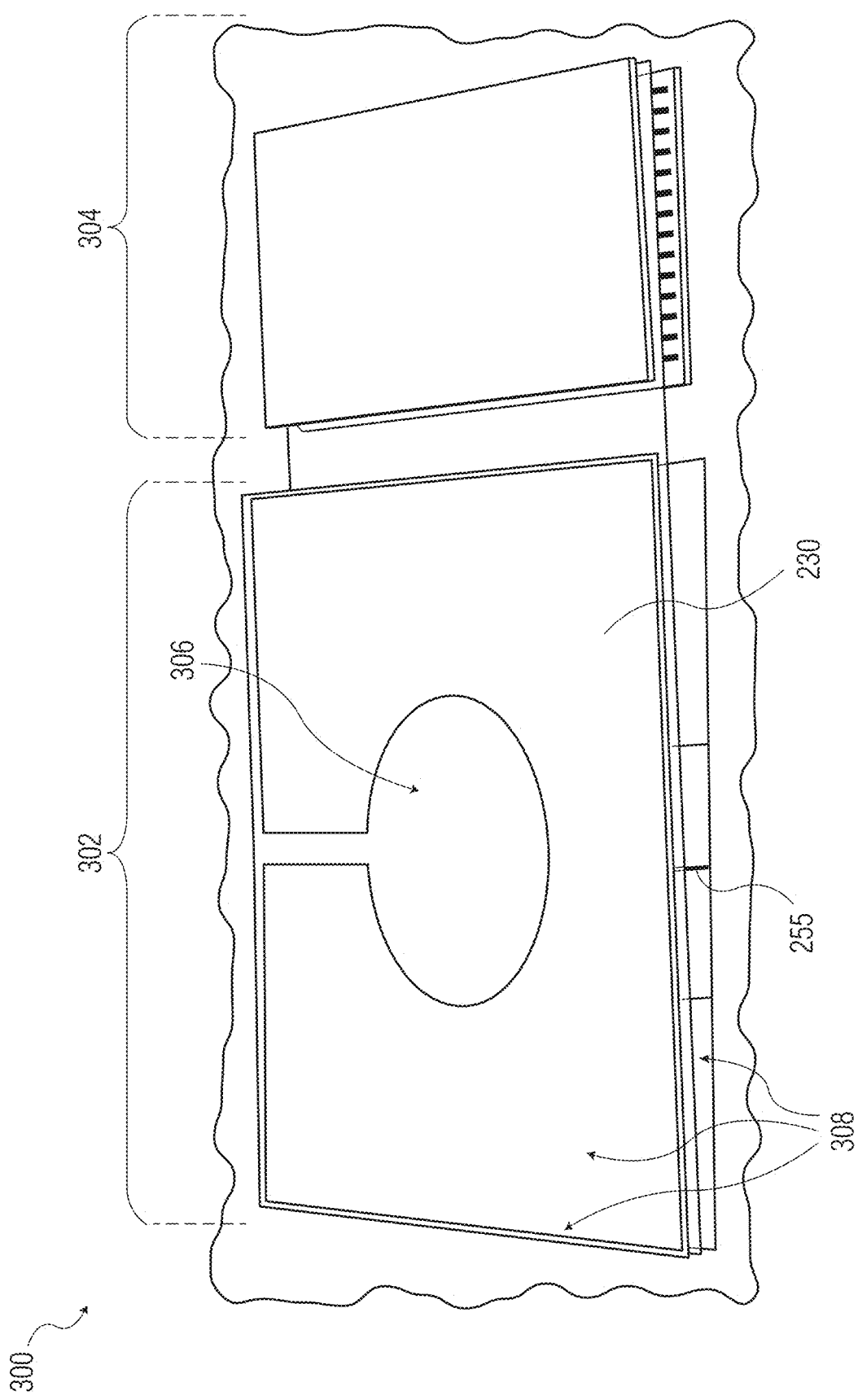
FIG. 3B is an example second side of the dual coil NFEMI device.

Both coils 215 and 217 may be air coils, wrapped around a ferrite core 210 (as shown in FIG. 2), or they can be in the form of a planar structure (see FIGS. 3A and 3B for an example planar coil structure).

In the ferrite core 210 version, the coils 215 and 217 may be wrapped around the core 210 in an interleaved fashion, or wrapped on top of one another, i.e., the second coil 217 is first wrapped around the core 210, and then the first coil 215 is then wrapped around the core 210 on top of the second coil 217.

Connection point 245 couples one end of the first coil 215 to a first feeding connection 235 and to the first plate of the small loaded dipole 225. Connection point 250 couples another end of the first coil 215 to one end of the second coil 217 and to a second feeding connection 240. Connection point 255 couples another end of the second coil 217 to the second plate 230 of the small loaded dipole 220. For clarity, connections 245, 250 and 255 are also shown in FIGS. 3A and 3B.

FIG. 3A is an example first side of a manufactured dual coil NFEMI antenna device 300. FIG. 3B is an example second side of the dual coil NFEMI device 300. FIGS. 3A and 3B are now discussed together.

While, as will be discussed below, device 300 uses planar coils for its magnetic antenna fields, for the sake of clarity the discussion for FIG. 3 will reuse reference numbers from the dual-coil device 200 discussed in FIG. 2 that uses ferrite wrapped coils for its magnetic antenna fields.

The device 300 includes a near-field antenna portion 302 and an electronic circuit portion 304 (e.g. a wireless module). The near-field antenna portion 302 includes a first planar coil 215 (L1) and a second planar coil 217 (L2) (i.e. near-field magnetic portion). The antenna 302 also includes a first conductive plate 225 and a second conductive plate 230 in a short loaded monopole configuration (i.e. near-field electric portion). The coils 215, 217 and plates 225, 230 in FIG. 3 are operationally similar to the coils 215, 217 and plates 225, 230 in FIG. 2.

Both planar coils 215, 217 are electromagnetically coupled and connected in a series arrangement. Both coils 215, 217 are connected to form a larger inductance as compared just the inductance L1 of the first coil 215 or the inductance L2 of the second coil 217.

Both coils 215, 217 are coupled to an insulating dielectric 308 (e.g. carrier of plastic or other non-conductive material).

Connection 245 of the first coil 215 is connected to the first conductive plate 225 and to a first feeding connection 235. Connection 250 of the first coil 215 is connected to one end of the second coil 217 and to a second feeding connection 240. Connection 255 of the second coil 217 is connected to the second conductive plate 230.

As shown, conductive plates 225, 230 are spaced apart and both include a non-conductive area 306 overlapping both coils 215, 217.

Figure 4:
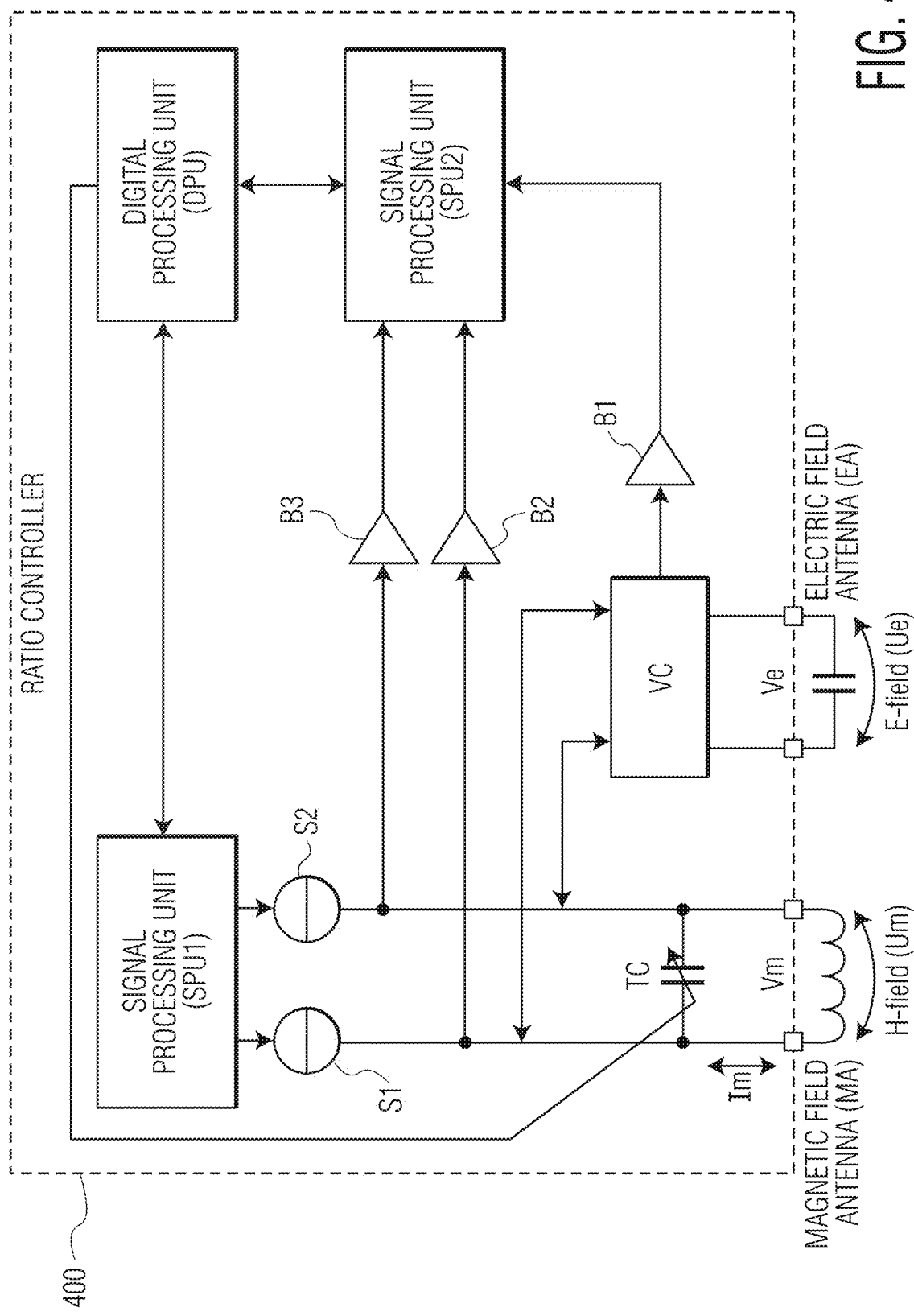
FIG. 4 is an example embodiment of an NFEMI H-field to E-field ratio controller.

FIG. 4 is an example embodiment of an NFEMI H-field to E-field ratio controller 400. The ratio controller 400 operates on the following two principles.

The first principle is that an NFEMI antenna's H-field signal, is not as attenuated by intervening structures (e.g. a conductive structure, a human body, an object, etc.) as the E-field signal is, but can have a relatively shorter communications range than the NFEMI antenna's E-field signal.

The second principle is that the NFEMI antenna's E-field signal, has a greater range than the NFEMI antenna's H-field signal, but is more attenuated by intervening structures than the H-field signal is.

Thus for NFEMI antenna nodes wholly or partially blocked by a structure, decreasing a ratio of energy in the E-field signal to energy in the H-field signal better enables the NFEMI antenna to still communicate through the structure. In some example embodiments, the ratio is set to less than one (i.e. Amplitude(E-field)/Amplitude(H-field)<1). This ratio apportions the NFEMI's transmit and/or receive energy primarily or completely to the H-field component during near-field communications such front-to-back node communications on a human body.

However for nodes not wholly or partially blocked by a structure but separated by a greater distance, a ratio between the E-field and the H-field amplitudes is increased and thus better enables the NFEMI antenna to also still communicate over longer distances. In some example embodiments, the ratio set to greater than one (i.e. Amplitude(E-field)/Amplitude(H-field)>1). This ratio apportions the NFEMI's transmit and/or receive energy primarily or completely to the E-field component during such head-to-toe node communications on a human body.

The ratio may be calculated in various ways such as: electric field (E-field) energy divided by magnetic field (H-field) energy, electric field (E-field) amplitude divided by magnetic field (H-field) amplitude, and/or electric field (E-field) phase subtracted by magnetic field (H-field) phase (e.g. phase ratio=$e^{i(ph_E - ph_H)}$).

Thus the H-field holds an important advantage where communication is required between nodes separated by structures (e.g. front-to-back of a body). The E-field however holds an important advantage in where communication is required between nodes that are positioned further from each other along a structure (e.g. head-to-toe, chest-to-foot, etc.). The ratio controller 400 modulates the H-field to E-field energy ratio using devices such as an RF-IC (integrated circuit) or an Electromagnetic Induction Radio (EIR), an example of which is shown in FIG. 4.

In the example embodiment of FIG. 4, the ratio controller 400 includes a digital processing unit (DPU), signal processing units SPU1 and SPU2, signal generators S1 and S2, buffers B1, B2, B3, a magnetic field antenna coil (MA), and an electric field antenna (EA) (e.g. a capacitor).

The DPU controls the operation of the radio 400 and processes the signals related to the near-field communication. Signal processing units SPU1 and SPU2 contain hardware to interface to the antennas MA, EA and the DPU. SPU1 and SPU2 are connected to additional baseband circuitry (not shown) that either generates or receives the data in the near-field signals. SPU1 generates near-field transmit signals and SPU2 receives near-field signals.

In transmit mode, the H-field (Um) is generated by a first alternating current (Im) through (i.e. first alternating voltage (Vm) across) the magnetic antenna MA, while the E-field (Ue) is generated by a second alternating voltage (Ve) on the electric antenna EA. The two voltages Vm and Ve thus define the H-field (Um) and E-field (Ue) respectively. Changing one of the amplitudes of Vm and Ve or a phase between them, changes a ratio of signal strengths between the H-field and the E-field. Blending of these fields improves the robustness and performance of the wireless communication system.

Signal processing unit SPU1 commands signal generators S1 and S2 to produce currents that drive the resonating circuit formed by coil MA and tuning capacitor (TC). Sources S1 and S2 generate the near-field signal to be transmitted.

The ratio of signal strengths between the H-field and the E-field can in some example embodiments be controlled by a voltage processing unit (VC). The voltage processing unit (VC) modulates, in either transmit or receive modes, the voltage Vm on the magnetic antenna MA and voltage Ve on the electric antenna EA. The VC may reduce or increase either an amplitude or phase of voltage Ve relative to Vm. In this way the ratio between the H-field and the E-field may be changed depending upon which pair of NFEMI nodes are communicating.

In receive mode the voltages received by the magnetic MA and electric EA antennas may be combined, amplitude modulated and/or phase modulated.

Thus the ratio controller 400 enables robust node to node NFEMI communication by varying the ratio of the E-field to the H-field depending upon which node is communicating to which node. A different ratio can be used for each pair of communicating nodes.

The exact ratio used between a particular set of near-field nodes depends upon: a distance between the nodes, attenuation due to a structure between the nodes, or some combination of both distance and attenuation limitations. In this way node to node communications can be optimized and a signal to noise ratio maximized.

While the E-field component of NFEMI communication is less sensitive to a relative orientation of various NFEMI antenna nodes than the H-field based NFEMI communications. In some example embodiments, communications robustness is further enhanced by selectively orienting H-field coils between certain NFEMI nodes that are otherwise blocked by the structure (e.g. human body).

For example, a first NFEMI device when transmitting (e.g. at the front of the human body) should generate an H-field that is oriented as such that it induces a maximum voltage in the second NFEMI receiving device node (e.g. at the back of the human body). In the case of planar NFEMI antennas (i.e. see FIGS. 3A and 3B) this means that the planar coils 215, 217 of both the first and second NFEMI device nodes should be placed parallel, and not perpendicular. Otherwise, in some examples, a Received Signal Strength (RSS) could drop in some examples by 20 dB or more.

Figure 5C:
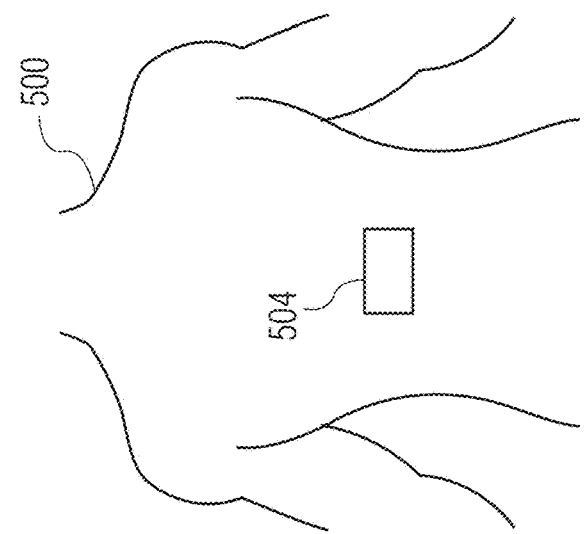
FIGS. 5A, 5B, and 5C are example side, front and back views a structure.
Figure 5B:
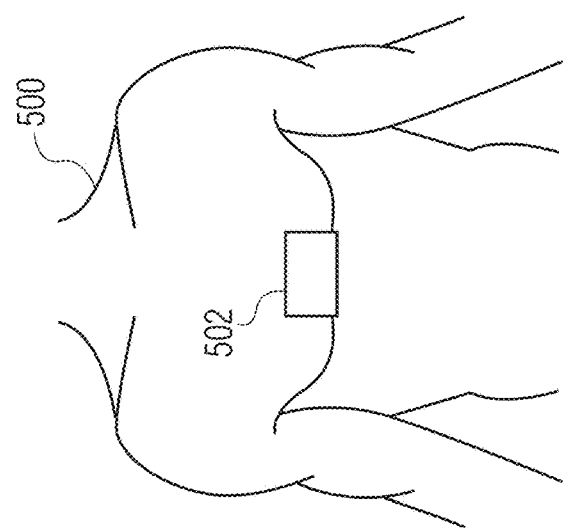
Figure 5A:
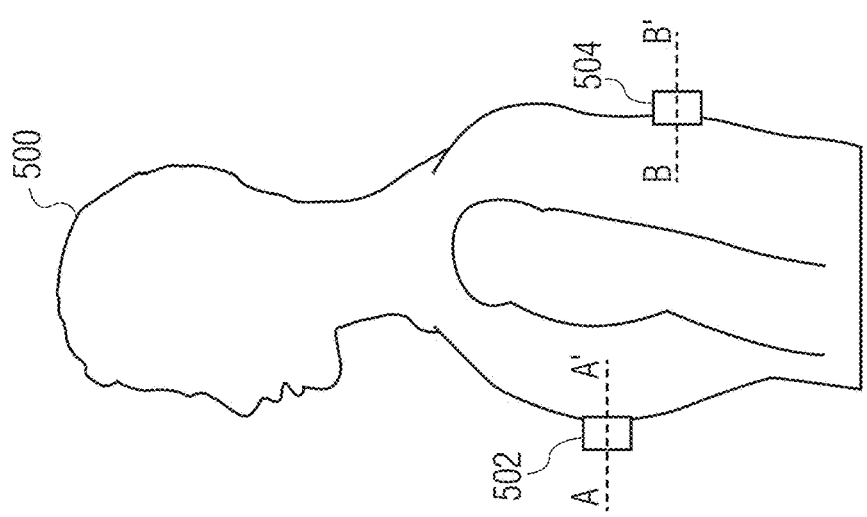

FIGS. 5A, 5B, and 5C are example side, front and back views a structure 500 (e.g. top half of a wearable user's body). A first NFEMI device 502 is positioned on the user's 500 chest, at the sternum, and a second NFEMI device 504 is positioned on the user's 500 spine, at the lower thoracic dorsal vertebra. In this example, both NFEMI devices 502, 504 are oriented with their magnetic (H-field) antennas placed parallel to the user's 500 skin and parallel with respect to each other.

The dotted lines A-A' and B-B' denote the imaginary normal line which is found perpendicular to the windings of the planar magnetic antenna coil of devices 502, 504. These lines are shown to demonstrate that for a planar NFEMI antenna the transmitting and receiving antenna are oriented as such to maximize the H-field communications link between the devices 502, 504.

For a given first device 502 transmit voltage (Vm), the received signal strength (RSS) at the second device 504 is about 73 dBuV. In contrast, for an NFEI only (e.g. E-field only) antenna, the RSS would likely be below the second device's 504 sensitivity level (e.g. of 32 dBuV).

Figure 6B:
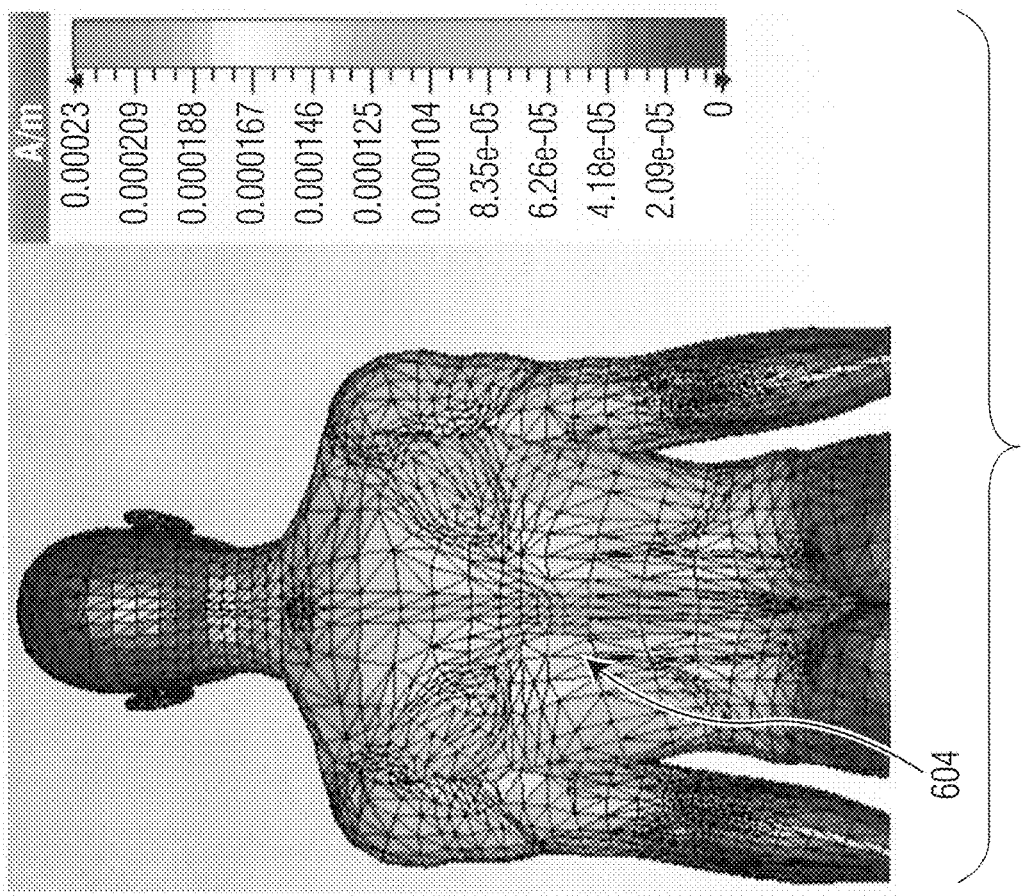
FIGS. 6A and 6B are example embodiments of respectively simulated E-field and simulated H-field on the structure of FIGS. 5A, 5B and 5C.
Figure 6A:
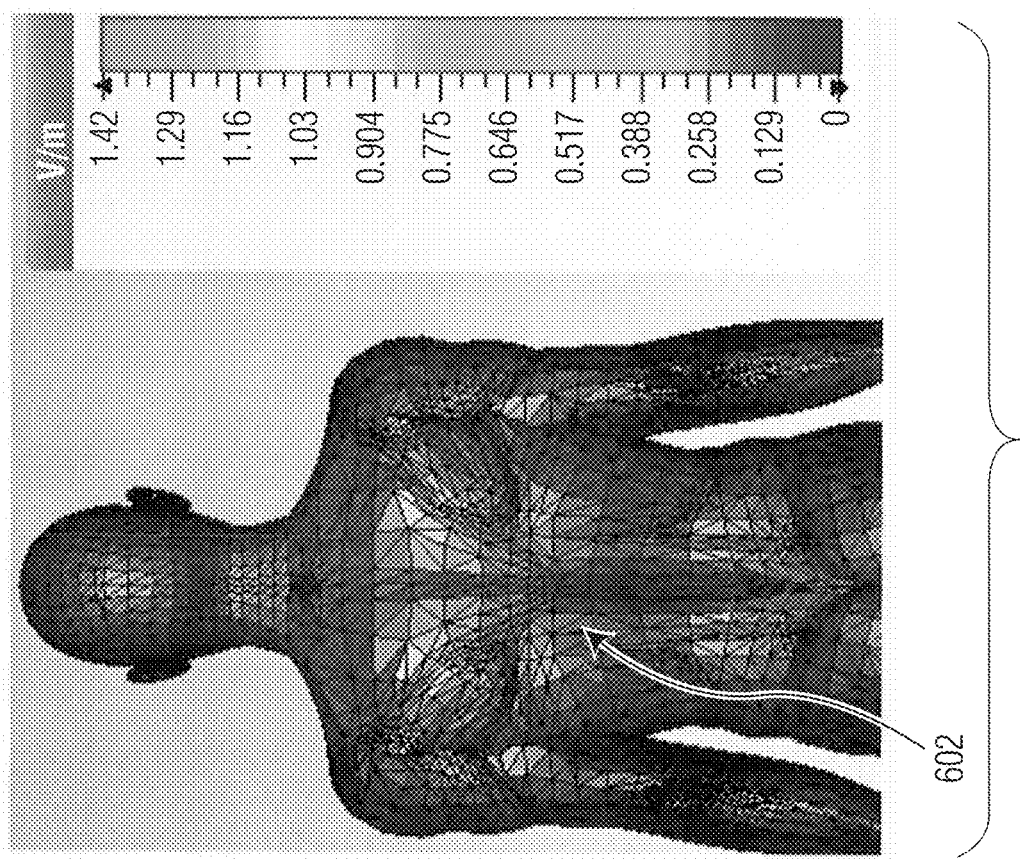

FIGS. 6A and 6B are example embodiments of respectively simulated E-field 602 (Volts/meter, V/m) and simulated H-field 604 (Amps/meter, A/m) on the structure 500 of FIGS. 5A, 5B and 5C. In this example the first NFEMI device 502 is positioned at a front-side of the structure 500 (e.g. at a chest of the body) and the second NFEMI device 504 is positioned at a back-side of the structure 500 (e.g. at a spine of the body).

FIG. 6A shows the example simulated E-field 602 at the back-side of the structure 500 when the controller 400 sets a high (e.g. increased, greater than one, etc.) amplitude ratio between the E-field and the H-field and thus the E-field is dominating. In this example, the E-field 602 generated by the first NFEMI device 502 is positioned at a front-side of the structure 500 is not strong enough to be detected by the second device 504 attached to the back-side of the structure 500.

FIG. 6B shows the example simulated H-field 604 at the back-side of the structure 500 when the controller 400 sets a low (e.g. decreased, less than one, etc.) amplitude ratio between the E-field and the H-field and thus the H-field is dominating. In this example, the H-field 604 generated by the first NFEMI device 502 is positioned at a front-side of the structure 500 is strong enough to be detected by the second device 504 attached to the back-side of the structure 500. Signal strength is enhanced when the orientation of the magnetic field (H-field) vectors of the first and second devices 502, 504 is parallel (i.e. not perpendicular) to each other.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transient computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transient machine or computer-usable media or mediums as defined herein excludes signals, but such media or mediums may be capable of receiving and processing information from signals and/or other transient mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A first near-field electromagnetic induction (NFEMI) device, comprising:
    a controller configured to be coupled to an NFEMI antenna and to a structure;
    wherein the NFEMI antenna includes an electric (E) near-field portion and a magnetic (H) near-field portion;
    wherein the electric (E) near-field portion includes a conductive plate and the magnetic (H) near-field portion includes a coil;
    wherein the controller is configured to modulate a ratio of energy sent to and/or received from the electric near-field portion and the magnetic near-field portion based upon both a signal corresponding to whether the structure is between the first NFEMI device and a second NFEMI device and a distance between the first NFEMI device and the second NFEMI device; and
    wherein the controller is configured to decrease the ratio of energy sent to and/or received from the electric (E) near-field portion as compared to energy sent to and/or received from the magnetic (H) near-field portion after the structure is between the first NFEMI device and the second NFEMI device.

2. The device of claim 1, wherein the controller is further configured to increase the ratio of the energy sent to and/or received from the electric (E) near-field portion as compared to the energy sent to and/or received from the magnetic (H) near-field portion after the structure is not between the first and second NFEMI devices.

3. The device of claim 1:
    wherein the ratio is calculated as: electric field (E-field) energy divided by magnetic field (H-field) energy.

4. The device of claim 1:
    wherein the ratio is calculated as: electric field (E-field) amplitude divided by magnetic field (H-field) amplitude.

5. The device of claim 1:
    wherein the ratio is calculated as: electric field (E-field) phase subtracted by magnetic field (H-field) phase.

6. The device of claim 1, wherein the controller is configured to receive the signal corresponding to whether the structure is between the first and second NFEMI devices from at least one of: inertial sensors, a user input, a communication between the first and second NFEMI devices with respect to a location reference, wireless, cellular, and/or GPS reference.

7. The device of claim 1:
    wherein between includes at least one of: wholly blocked, partially blocked, on a different side of the structure, not on a same side of the structure, on front to back sides, or on left and right sides.

8. The device of claim 1, further comprising:
    a plurality of NFEMI devices.

9. The device of claim 8, wherein a unique ratio is used for each pair of communicating NFEMI device.

10. The device of claim 1:
    wherein the NFEMI antenna of the first NFEMI device has a first magnetic field orientation;
    wherein the second NFEMI device includes an NFEMI antenna having a second magnetic field orientation; and
    wherein the first magnetic field orientation is in parallel with the second magnetic field orientation.

11. The device of claim 10:
    wherein the structure is a human body; and
    wherein the first NFEMI device is positioned at a chest location on the human body, and the second NFEMI device is positioned at a spine location on the human body.

12. The device of claim 1:
    wherein the structure is a conductive structure.

13. The device of claim 1:
    wherein the structure is at least one of: an organic structure, a biological surface, an inorganic structure, a package, clothing, a vehicle surface, a chair, a wall, and/or a merchandise item.

14. The device of claim 1:
    wherein the device is embedded in at least one of: a smart phone, a smart watch, a sensor, a medical sensor, or an audio device.

15. The device of claim 1:
    wherein the ratio is decreased by increasing the magnetic field energy.

16. The device of claim 1:
    wherein the ratio is decreased by decreasing the electric field energy.

17. The device of claim 1:
    wherein the NFEMI antenna interface includes first and second coupling points;
    wherein an H-field signal is generated by the coil coupled to the first and second coupling points; and
    wherein an E-field signal is generated by the conductive plate coupled to either of or both the first and second coupling points.

18. The device of claim 17:
    wherein the conductive plate is a first conductive plate, further comprising a second conductive plate separated by a distance; and
    wherein the first conductive plate is coupled to the first coupling point and the second conductive plate is coupled to the second coupling point.

19. The device of claim 1, further comprising:
    the NFEMI antenna coupled to the controller; and
    a transmitter and/or to a receiver circuit coupled to the controller.

20. An article of manufacture including at least one non-transitory, tangible machine readable storage medium containing executable machine instructions for near-field electromagnetic induction (NFEMI) communication when executed by a processor, comprising:
    wherein the article includes, a first near-field electromagnetic induction (NFEMI) device including a controller;

wherein the controller configured to be coupled to an NFEMI antenna and to a structure;

wherein the NFEMI antenna includes an electric (E) near-field portion and a magnetic (H) near-field portion;

wherein the electric (E) near-field portion includes a conductive plate and the magnetic (H) near-field portion includes a coil; and wherein the instructions include, modulating a ratio of energy sent to and/or received from the electric near-field portion and the magnetic near-field portion based upon both a signal corresponding to whether the structure is between the first NFEMI device and a second NFEMI device and a distance between the first NFEMI device and the second NFEMI device; and decreasing the ratio of energy sent to and/or received from the electric (E) near-field portion as compared to energy sent to and/or received from the magnetic (H) near-field portion after the structure is between the first and second NFEMI devices.

* * * * *